US00RE34445E

United States Patent [19]

Hayes et al.

[11] E Patent Number: Re. 34,445

[45] Reissued Date of Patent: Nov. 16, 1993

[54] SELF-TESTING DYNAMIC RAM

[75] Inventors: John P. Hayes, Ann Arbor, Mich.; Younggap You, Seoul, Rep. of Korea

[73] Assignee: University of Michigan, Ann Arbor, Mich.

[21] Appl. No.: 551,477

[22] Filed: Jul. 12, 1990

Related U.S. Patent Documents

Reissue of:

[64] Patent No.: 4,757,503
Issued: Jul. 12, 1988
Appl. No.: 34,498
Filed: Apr. 3, 1987

U.S. Applications:

[63] Continuation of Ser. No. 692,950, Jan. 18, 1985, abandoned.

[51] Int. Cl.[5] ..... G01R 31/28

[52] U.S. Cl. ..... 371/21.1; 371/21.2; 371/68.1

[58] Field of Search ..... 371/21.2, 25.1, 68.1, 371/21.1; 365/201, 149; 324/73.1

[56] References Cited

U.S. PATENT DOCUMENTS

| | | | |
|---|---|---|---|
| 3,924,181 | 12/1975 | Alderson | 371/27 |
| 4,038,648 | 7/1977 | Chesley | 371/11.1 |
| 4,176,258 | 11/1979 | Jackson | 371/68.1 |
| 4,363,124 | 12/1982 | Aichelmann, Jr. | 371/21.2 |
| 4,506,351 | 3/1985 | Scheuerlein et al. | 365/149 |
| 4,510,603 | 4/1985 | Catiller | 371/21.2 |
| 4,533,843 | 8/1985 | McAlexander, III et al. | 365/149 |
| 4,541,090 | 9/1985 | Shiragasawa | 371/21.2 |
| 4,541,094 | 9/1985 | Stiffler et al. | 371/68.3 |

OTHER PUBLICATIONS

Konemann et al., Built-In Test for Complex Digital Integrated Circuits, Fifth European Solid State Circuits Conference, pp. 89-90, 18-21 Sep. 1979.

LeBlanc, LOCST: A Built-In Self-Test Technique, IEEE Design and Test, Nov. 1984, pp. 45-52.

*Primary Examiner*—Charles E. Atkinson

*Attorney, Agent, or Firm*—Rohm & Monsanto

[57] ABSTRACT

Very large dynamic RAM integrated circuits are rendered self-testing by using on-chip generation of data test patterns with very high fault coverage, and concurrent testing of storage cell subarrays to reduce overall testing time. A test generator, which may operate in combination with the refresh control and timing system of the RAM integrated circuit, supplies the initial data test pattern which is loaded into the storage arrays. The conventional sense amplifier array is modified, and coupled with a gate control system for shifting data in each column of each storage subarray to an adjacent column. Alternatively, a two-terminal bilateral storage cell may be used to effect the shifting function, which effectively converts the memory into a shift register. The use of complementary data test patterns will permit detection of symmetrical faults within storage arrays.

42 Claims, 5 Drawing Sheets

SELF-TESTING DYNAMIC RAM

Matter enclosed in heavy brackets [ ] appears in the original patent but forms no part of this reissue specification; matter printed in italics indicates the additions made by reissue.

This application is a continuation of application Ser. No. 692,950 filed Jan. 18, 1985 now abandoned.

BACKGROUND OF THE INVENTION

This invention relates generally to testing schemes for microelectronic memories, and more particularly, to a self-testing memory system for a dynamic RAM, the system using circuitry included on the memory chip for testing all common failure modes.

The testing of computer memories has always been difficult and time consuming, and more recently, as microelectronic memories become available in increased capacities, illustratively into the 1 Megabit range, significant problems are encountered in reliably and economically testing such memory for each of the large variety of the possible failure modes. Improvements in very large scale integration (VLSI) technology have resulted in dramatic increases in the capacities of random access memories (RAMs), particularly dynamic integrated RAMs. Under some widely used existing test schemes, the testing time is proportional to the square of the capacity of the memory. Thus, the testing of a 1K RAM may take only a few seconds, but the testing of a 64K RAM may require several hours. In addition, as memory size increases, additional and complex failure modes, such as pattern sensitivity, become more common. Testing for such complex failure modes rapidly increases the test complexity.

GALPAT is a widely used test procedure which is of the type requiring test time to be proportional to the square of the memory capacity. This known testing procedure is heuristic in nature, thereby providing incomplete fault coverage. In essence the GALPAT procedure requires writing a zero value into each of the storage cells of the RAM. A one value is then written into the first cell, and the remaining cells are read and their contents are verified in turn. After each such cell is checked to see that it correctly stores a zero value, the first cell, in which the one value is stored, is checked to insure that its data has not been changed by failure-induced interaction between cells. This testing step requires 2n read operations and is repeated with each cell serving sequentially as the test cell. The entire process is then repeated with the zero values and one values interchanged. There are therefore required approximately $4n^2$ read and write operations to execute the GALPAT procedure.

Prior art efforts at reducing testing time of a digital system have resulted in the production of self-testing RAMs by use of known error detecting and error correcting codes. It is a problem with such error detecting systems that substantial extra circuitry is required to generate and store various signals and check bits. Such systems may also require extensive replication for purpose of comparison which also increases circuit complexity and cost. In addition to such complexity and cost, error detecting systems using codes suffer from the further disadvantage that fault coverage is difficult to determine. Moreover, the complete replication of a design for purposes of massive redundancy on a single chip is too costly for most applications. Thus, known systems for testing RAM designs using coding or replication techniques rely on external sources to provide the various test sequences required to achieve complete testing of a chip, and accordingly, little work has been done to achieve on-chip test generation. Notwithstanding such use of complex external testing apparatus, many types of physical faults cannot be detected by any given error-detecting code.

It is therefore, an object of this invention to provide a testing system for dynamic RAMs which achieves testing in a relatively short period of time.

It is another object of this invention to provide a memory test system applicable to a variety of memory capacities wherein the test time is not necessarily related to the square of the memory capacity.

It is also an object of this invention to provide a memory test system which does not require massive redundancy to achieve testing.

It is an additional object of this invention to provide a test scheme which is not heuristic.

It is a further object of this invention to provide a test scheme which is suitable for RAMs.

It is additionally an object of this invention to provide a memory test system which is installed on RAM chips themselves.

It is still another object of this invention to provide a memory test system which tests a plurality of storage cells simultaneously.

It is a yet further object of this invention to provide a memory test system which can detect a variety of failure modes in addition to single cell defects.

It is also another object of this invention to provide a memory test system which can self-test a computer memory system.

It is still an additional object of this invention to provide a memory test system which can restructure a memory system using excess storage cells to correct for detected defects.

It is also a further object of this invention to provide a memory test system which can be installed on a memory chip without extensive modification of conventional circuitry already on the memory chip.

It is yet an additional object of this invention to provide a memory test system which uses memory control and logic circuitry already on the memory chip in performance of the testing function.

It is a still further object of this invention to provide a memory test system which uses memory refresh circuitry of the type which is installed in known memory chips.

It is also an additional object of this invention to provide a memory test system which can be applied to a variety of known RAM chip organizations without significant changes to the system.

It is yet another object of this invention to provide a memory test system which can detect defects in dynamic MOS memories resulting from gate oxide defects.

Another object of this invention is to provide a memory test system which can detect defects in dynamic MOS memories resulting from leakage from a storage cell capacitor.

A further object of this invention is to provide a memory test system which can detect defects in dynamic MOS memories resulting from leakage from a bit line.

An additional object of this invention is to provide a memory test system which can detect defects in dynamic MOS memories resulting from parasitic resistance.

A yet further objecty of this invention is to provide a memory test system which can detect defects in dynamic MOS memories resulting from parasitic capacitance.

Yet an additional object of this invention is to provide a memory test system which can detect failure modes in address buffers.

A still further object of this invnetion is to provide a memory test system which can detect failure modes in address decoders.

Additionally, it is an object of this invention to provide a memory test system which can detect failure modes in refresh control logic circuitry.

A yet further object of this invention is to provide a memory test system which can detect failure modes in data buffers.

SUMMARY OF THE INVENTION

The foregoing and other objects are achieved by this invention which provides a dynamic RAM integrated circuit of the type having at least two storage arrays, each such array being formed of a plurality of storage cells organized in rows and columns. The RAM integrated circuit is provided with a row address decoder and a column address decoder which operate to select a desired storage cell in each of the storage arrays. After a read operation, a refresh circuit restores the informaational status of each such storage cell read. The relatively low signal value stored in each such cell is amplified by a sense amplifier which detects the informational status of each storage cell. In accordance with the invention, a test generator is formed on the RAM integrated circuit and coupled to the refresh circuit. The test generator produces a predetermined test pattern sequence which is applied to each of the storage arrays. Responsive signals are obtained from each storage array, corresponding ones of the response signals from each storage array being compared to one another in a comparator circuit.

The testing scheme of the present invention utilizes an inventively modified sense amplifier which includes a shift controller for transferring the logic states of the storage cells in a column of the storage array to another such column, illustratively an adjacent column. In one embodiment of the invention, the inherent bidirectionality of the sense amplifier is used in effecting a logic state transfer between columns of the storage array. Transference of the logic state signals from one column to the other is achieved via a propagation path, which includes the sense amplifier, and which is gated in response to a shift control signal. In one specific embodiment of the invention, a modified sense amplifier and propagation path gate is provided for each column of the storage array.

The test generator is formed essentially of a test step selector, an initialization sequence generator, and a test sequence generator. The test step selector determines the major test step of the test sequence which is to be employed and the test bit, and activates the initialization sequence generator. The initialization sequence generator transfers predetermined data patterns into two storage arrays. The initialization of the specific storage cells which are under test is performed one cell at a time using a refresh counter in the refresh circuit, and the data buffer which stores the test bit. The numerical contents of the refresh counter are conducted to the row and column address decoders to select the storage cell to be tested. All of the storage cells in the storage array are initialized by a refresh operation, and therefore advantageously only two refresh operations are required to complete the data pattern initialization. Subsequently, the test sequence generator issues the excitation subsequence using logic circuitry associated with the refresh circuit. Issuance of the excitation subsequence is controlled by a shift counter in the test sequence generator. This counter is incremented when a shift operation is performed. When the test bit has been stored in every storage cell at least once, the shiftcounter overflows to indicate that the excitation sequence has been complete.

After each of the storage arrays has been loaded with a predetermined data test pattern, the data stored in each column of a storage array is read and compared against corresponding data and in a column of the other storage array. Such output signals which are responsive to the data test pattern are applied to respective inputs of an exclusive OR gate which is coupled at its output to a further gate which is connected a reference potential, and a test line is precharged to a predetermined voltage. In the event that the signals from the respective storage arrays do not agree with one another, the exclusive OR gate will cause the test line to be connected to the reference potential. Sensing circuitry, illustratively a sensing amplifier and an error latch are coupled to the test line to provide an indication of the disagreement.

In accordance with a method aspect of the invention, a RAM integrated circuit is self-tested by generating a data test pattern by a test generator which is formed integrally with the RAM integrated circuit. The data test pattern is then written into each of the storage arrays. The data in each column is shifted to an adjacent column such that each row of each storage array functions as a shift register. In essence, therefore, each storage array functions as a circularl shift register. The inventive method further includes the step of comparing the data stored in a column of a storage array with the data stored in a coresponding column of the other storage array, the comparison being formed by comparator circuitry formed integrally in the RAM integrated circuit.

In a method embodiment of the invention, an initial storage cell to be tested is selected using the numerical information stored in a counter of the refresh circuit for forming addresses in the respective rows and columns. The various volumns of data are then shifted to adjacent columns by incrementing a shift counter. Shifting is completed when the shift counter overflows.

The data test patterns which are used in the practice of the invention are configured so as to enable detection of failures resulting from oxide defects, leakage currents, parasitic capacitances and resistances, and other failure modes, such as row decoder failure and pattern sensitivity. More specifically, failures resulting from oxide defects include storage cells stuck at zero, stuck at one, stuck at word line, and bit word line crosstalk. Failures resulting from leakage current include the storage cell being stuck at bit line, sleeping sickness, neighborhood interference, and bit line imbalance. Failures resulting from parasitic capacitances and resistances include sense amplifier recovery problem, slow sense amplifier, and transmission line effect. These failure modes are tabulated and discussed in detail in an article entitled "A Self-Testing Dynamic RAM Chip", by Younggap You and John P. Hayes, Proceedings, Conference on Advanced Research In VLSI, MIT, pages 159-168, January, 1984. The disclosure of this article is incorporated herein by reference, in its entirety.

In a highly advantageous embodiment of the invention, circuitry other than the storage arrays, such as the test generator, the comparators, the data buffer, and the refresh logic circuitry are all made self-testing by duplication and comparison. The address buffers are tested by applying write and read operations to each buffer cell. The test sequences for the storage arrays constitute the tests for the address buffers. Disagreements among duplicated units are recorded in an error latch, and sent to the test step selector of the test generator to stop the testing process. When a test is halted as a result of the occurrence of faults, the contents of the refresh counter are shifted through the data signal line. Such shifting is controlled by the column address strobe signal.

The present invention provides significant advantages over known memory testing systems. First, the inventive system requires very short testing time since storage arrays are tested in parallel, and many cells within each such array are tested simultaneously. Testing time is also reduced by the shift operation which combines the functions of read, modify, and write operations. The required testing does not increase significantly with the capacity of the memory, particularly if the overall memory capacity is increased by adding storage subarrays of relatively constant size which can be tested in parallel. In addition, implementation of the present invention requires only small integrated circuit chip area when applied to a large-capacity memory. For example, the increase in chip area is less than 5% for a 1M bit dynamic RAM. Additionally, the required circuit area for accommodating the self-testing system of the present invention does not increase significantly with the capacity of the memory since it is limited essentially to the comparators and sense amplifiers.

The present invention can be adapted to detect all major failure types including pattern sensitive faults which occur in nMOS RAM chips. Additionally, the invention can be applied to other types of memories, such as static RAMs. The sense amplifier array used in fast static memories can be readily modified to implement the special shift operation. Additionally, the invention may be implemented to render the RAMs chip fault tolerant, thereby increasing reliability and manufacturing yield. Thus, redundant rows, columns, or entire storage arrays may be included on a RAM integrated circuit to replace faulty circuits.

In a specific illustrative embodiment of the invention, shifting of data signals from column to column within a storage array is achieved by providing a bilateral storage cell for each such column. The bilateral storage cell is provided with a storage element, illustratively a storage capacitor, which is connected to first and second gate members. The first gate member receives a logic state signal from a storage cell in the column associated with the bilateral storage cell, and conducts it to the storage capacitor. The second gate member selectably conducts the logic state signal to a correspondingly adjacent storage cell in the adjacent column. Each of the gate members is coupled at a control input thereof to respective shift control lines. Thus, the shift operation for all of the columns can be performed by applying shift control signals to the shift control lines.

BRIEF DESCRIPTION OF THE DRAWING

Comprehension of the invention is facilitated by reading the following detailed description in conjunction with the annexed drawings, in which.

DETAILED DESCRIPTION

Figure 1:
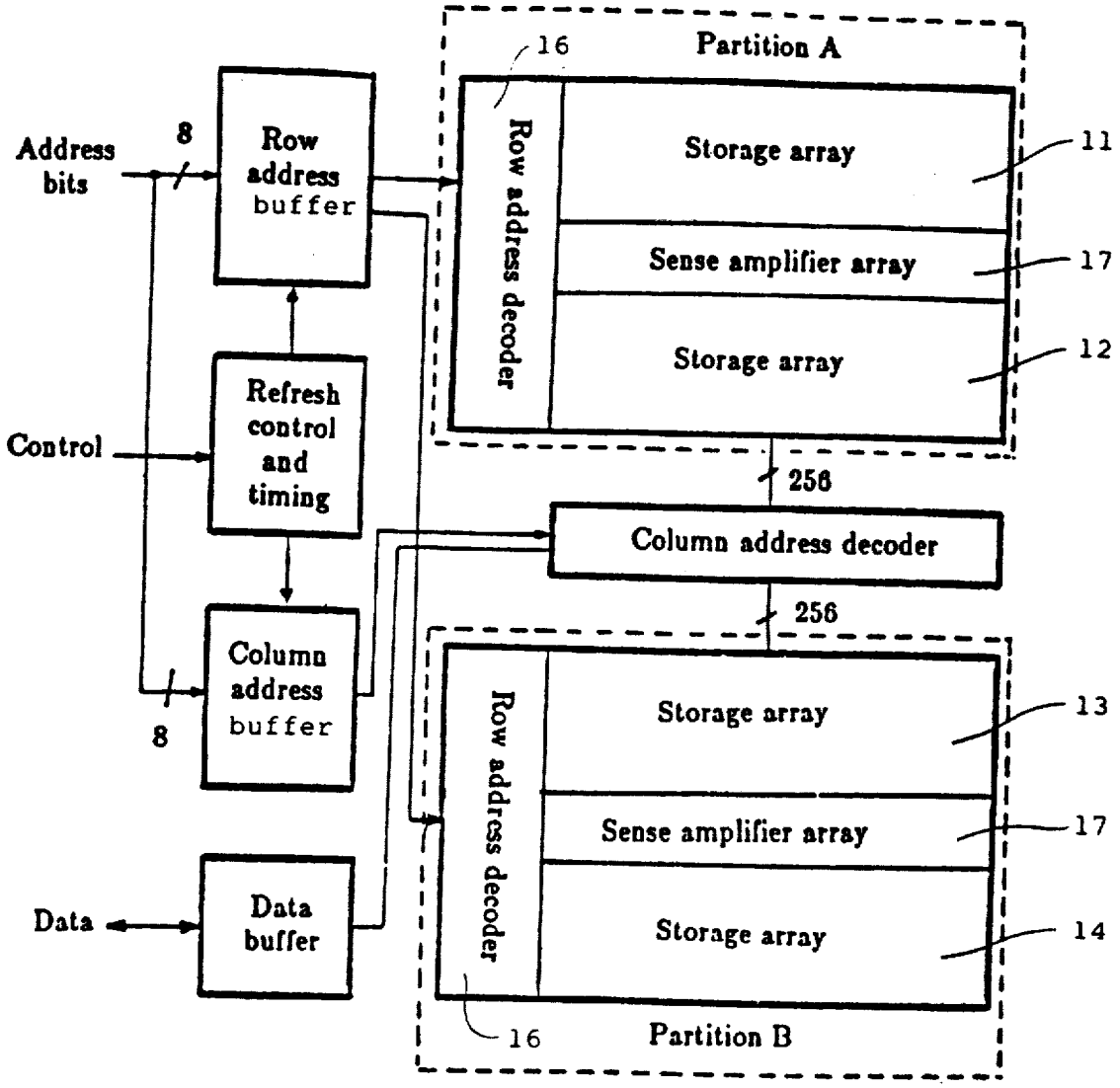
Figure 1 (Prior Art)
FIG. 1 is a block and line representation of the organization of a typical 64K dynamic RAM of the type which is available in the prior art.

FIG. 1 shows a prior art dynamic RAM integrated circuit (IC) organized as several large arrays of storage cells surrounded by addressing, sensing, and control circuitry. For example, in the representative 64K-bit memory shown in FIG. 1, four identical storage arrays 11, 12, 13, and 14 are provided on the integrated circuit, each consisting of 64×256 1-bit cells. In this known arrangement, one row address decoder 16 and 256 sense amplifiers in a sense amplifier 17 are shared by two storage arrays. The combination of a row address decoder, a sense amplifier array, and two storage arrays are referred to herein as a "partition", and therefore the arrangement of this figure is illustrated as having two partitions, A and B.

The present invention builds upon and modifies extensively the known arrangement in five significant ways to produce the self-testing RAM IC. First, input test patterns are generated by special on-chip logic circuits. Second, RAM partitions are designed so that they can be tested in parallel, thus reducing the overall testing time for large memories. Third, the data patterns (1 on a background of 0's, or vice versa) required by the various testing steps are produced by special sense amplifier circuits that allow all the cells in a storage array to act as a circular shift register during testing. Fourth, the standard refresh logic found in all dynamic RAMs is applied to scan all the partitions, concurrently shifting the data patterns, and generating test responses for verification purposes. Finally, the responses of the partitions are verified by an on-chip comparison circuit in order to detect failures.

Figure 2:
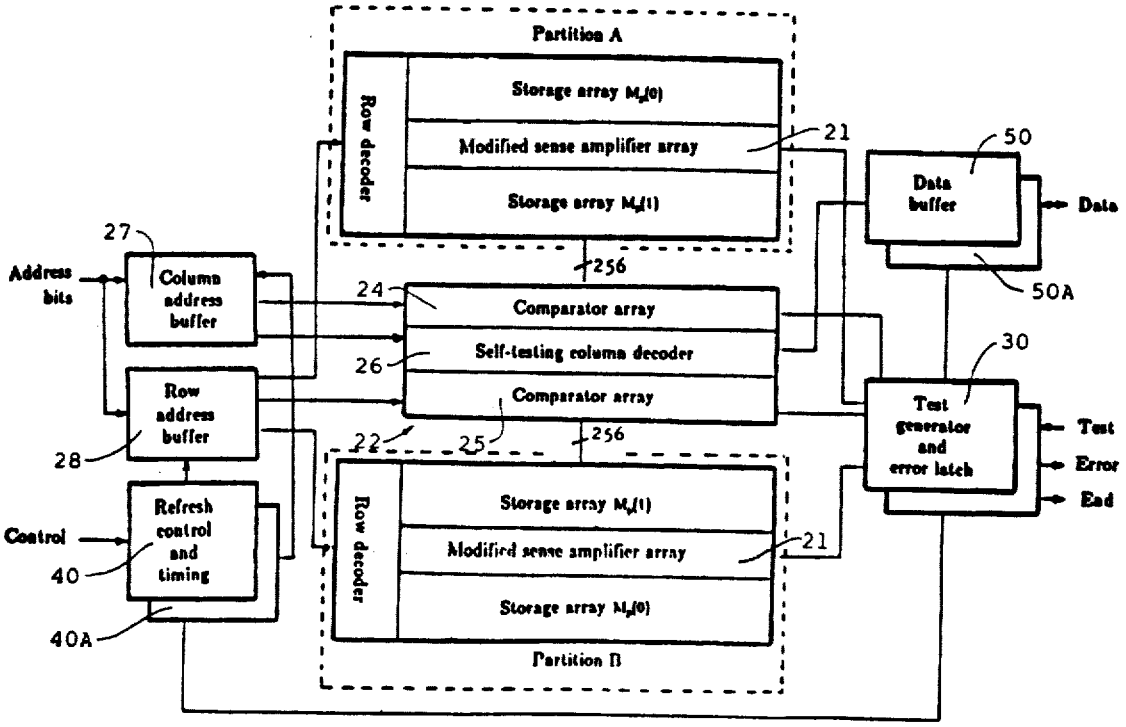
FIG. 2 is a block and line representation of the organization of a self-testing dynamic RAM constructed in accordance with the principles of the invention.

FIG. 2 is a block and line representation of one embodiment of a self-testing dynamic RAM constructed in accordance with the invention. The overall structure of the inventive self-testing RAM IC is based upon the two partition design, with modifications to the sense amplifiers in modified sense amplifier arrays 21 and column address decoder 22 which now includes a comparator array 24 and a comparator array 25, each associated with paritions A and B, and a self-testing column decoder 26.

The present invention incorporates a test generator 30 which is coupled to operate in conjunction with a refresh control and timing system 40. The necessary test pattern sequences are generated using test generator 30, refresh control and timing system 40, and modified sense amplifier arrays 21.

Testing of the memory is initiated by activating the test signal at an input to the test generator. The RAM IC then automatically generates the required test sequences and verifies the responses internally by comparing partition output signals. In the event that a fault is detected, an appropriate signal is produced at the error output of the test generator.

The test process is terminated either by completion of the test sequence, or by detection of failures. Termination is indicated by an appropriate output signal at the end signal terminal of the test generator.

Refresh control and timing system 40 contains within it a n-bit refresh counter (not shown) which is used to identify the location of faulty cells or lines. The information thus stored in the n-bit refresh counter facilitates any external repair activity. When the end and error signals are set, at the test generator, the refresh counter input is coupled to the column address strobe signal line (not shown) and the data latch input of data buffer 50 is coupled to the overflow signal of the n-bit refresh counter. The external column address strobe signal which is provided in a known manner increments the n-bit counter, and the overflow signal is sent out via the data buffer. The contents of the n-bit refresh counter are obtained by counting the number of external input pulses, received from the column address stobe signal, and subtracting this number from $2^n$.

In accordance with the testing scheme of the present invention, the test sequence must perform four basic steps repeatedly on evey cell of the RAM. First, a common data pattern must be written into the neighborhood cells of the cells being tested ($S_i$). Secondly, an excitation sequence of write operations is applied to cell $S_i$. Third, a read operation is applied to cell $S_h$ and fourth, the data patterns in the neighborhood cells are modified. The write, read, and modify steps are implemented by an on-chip shifting operation. In a specific illustrative embodiment of the invention, such shifting is achieved by utilizing sense amplifiers which have been modified in accordance with the invention.

Figure 3:
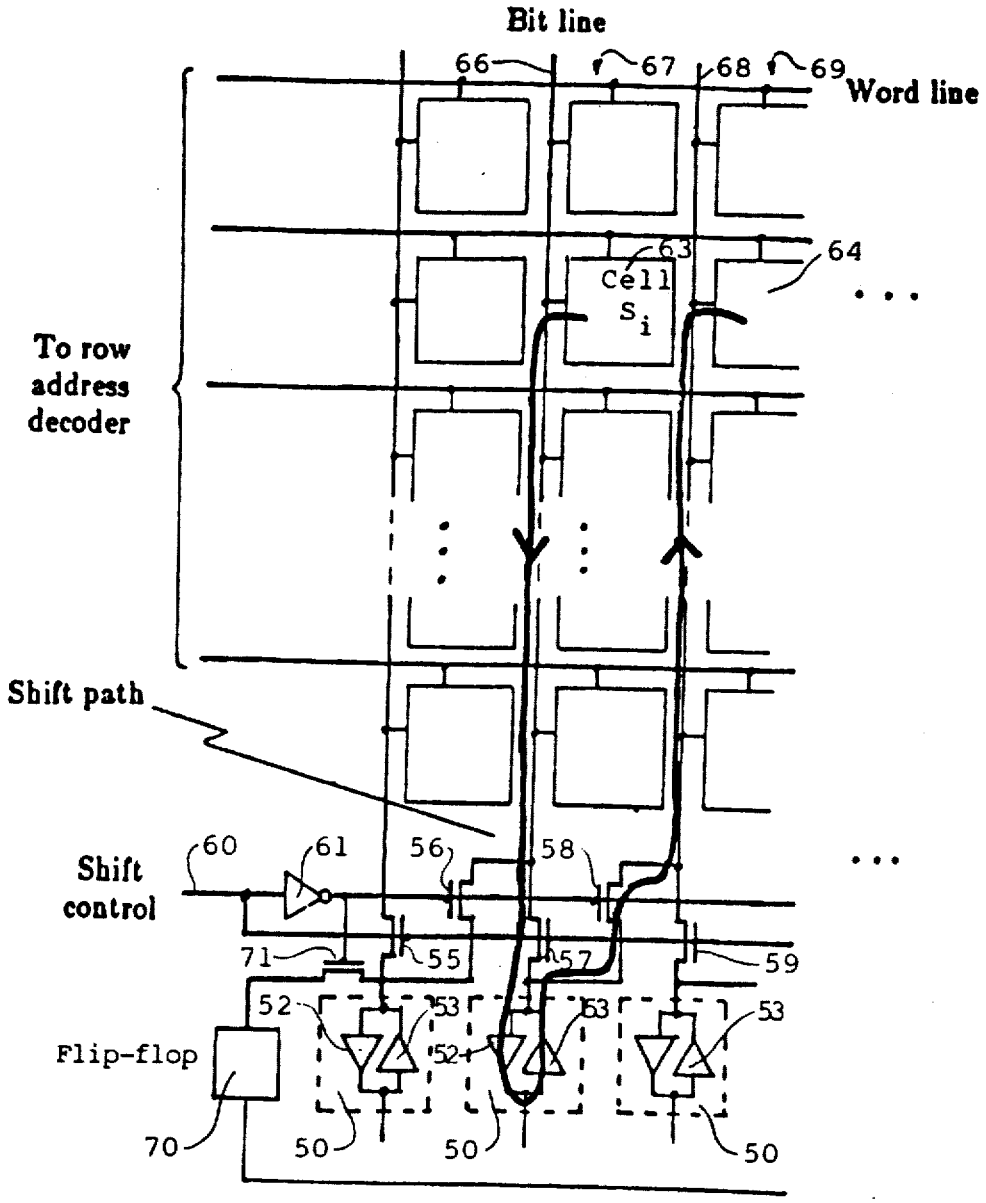
FIG. 3 is a partially schematic and partially block and line representation of a shift system which utilizes modifed sense amplifiers and gates in accordance with the invention.

FIG. 3 is a partially schematic and block and line representation of a specific illustrative embodiment of a modified sense amplifier system which is useful for shifting data such that when data is read from one cell column, it is immediately written into a corresponding cell in an adjacent cell column.

FIG. 3 shows modified sense amplifier array 21 having individual sense amplifiers 50. Each such sense amplifier is symbolically represented as having amplifiers 52 and 53 in this figure so as to illustrate that each sense amplifier 50 inherently can propagate a logic state signal in two directions.

Modified sense amplifier array 21 has associated with it a plurality of gates, illustratively gates 55, 56, 57, 58, and 59. Such gates are controlled by the application of a shift control signal at a shift control input 60. An inverting amplifier 61 insures that gates 56 and 58 receive an inverted version of the shift control signal which is applied to gates 55, 57, and 59.

To illustrate the operation of the shift control system and the modified sense amplifier array, it is assumed, in this example, that the logic state of a storage cell 63 is to be transferred to a storage cell 64. Storage cells 63 and 64 are adjacent to one another but in different columns. Storage cell 63 is in a column 67 which has an associated bit line 66. Storage cell 64, however, is located in a column 69 which has an associated bit line 68. As shown in FIG. 3, the logic state of storage cell 63 is conducted via bit line 66 through gate 57 so as to be amplified by amplifier 52 and returned by amplifier 53. The output of amplifier 53 is then conducted through gate 58 and via the bit line 68 to storage cell 64.

Assuming that the storage array contains p rows and q columns, each such q-cell row functions as a q-bit shift register. A flip-flop 70 operates with a gate 71 which is responsive to the output of inverting amplifier 61 to save data shifted out from the rightmost sense amplifier (not shown). This data is stored in flip-flop 70 and returned to the leftmost bit line where it is used during each subsequent shift step. In this manner, a recirculating or circular shift register is achieved. Since such shifting is performed for each row of the array, the entire array becomes an effective pq bit shift register.

The normal refresh control logic is adapted to control the special shift operations, and therefore no significant change to the sense amplifier arrays is needed for control purposes. It is therefore sufficient merely to introduce two more transistors per sense amplifier, and one new control line for each q-bit sense amplifier array, as shown in FIG. 3. While the cells are read by activating the word line selected by the row address in the n-bit refresh counter, the shift control line is also, in this embodiment, in the active (1) state. After the sense amplifiers sense the bit line, the shift control line changes to zero, changing the sensed data to the adjacent bit line. The shifted data bits are then written into the adjacent cells by activating the same word line. Thus, the original refresh logic can be used as the shift controller, with the addition of the control logic shown in FIG. 3.

Figure 4:
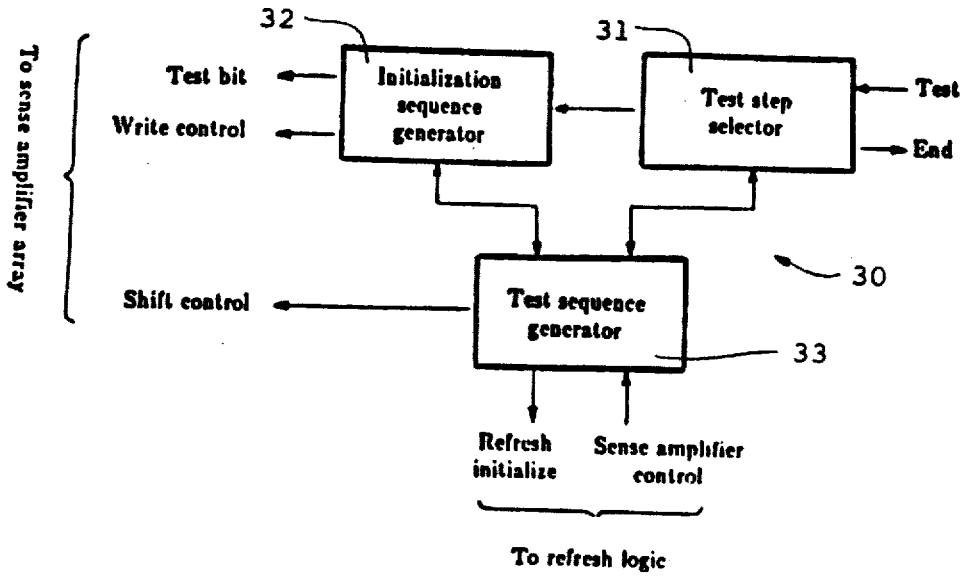
FIG. 4 is a block and line representation of a test generator circuit in accordance with the invention.

FIG. 4 shows the general organization of the on-chip test generator 30 used to produce the RAM test sequence. It consists of three main blocks: a test step selector 31, an initialization sequence generator 32, and a test sequence generator 33. Test step selector 31 determines the major test step of the test sequence and the test bit, and activates initialization sequence generator 32. Initialization sequence generator 32 transfers data patterns determined by the test bit x into the two storage arrays $M_p(1)$ and $M_p(0)$, as shown in FIG. 2, in a partition in two steps: first transferring $\bar{x}$ into $M_p(1)$ and x into $M_p(0)$, and then transferring x into the set of cells under test $M_s(k)$. The initialization of $M_p(0)$ and $M_p(1)$ is performed one row at a time by maintaining the bit lines of $M_p(1)$ at $\bar{x}$, and performing refreshing. Since the bit lines of $M_p(1)$ and $M_p(0)$ are held at x and x, respectively, refreshing simply transfers $\bar{x}$ to $M_p(1)$ and x to $M_p(0)$. The initialization of the cells under test $M_s(k)$ is performed one cell at a time using the refresh counter, and the data buffer which already stores the test bit x. First, the contents of the n-bit refresh counter are routed to the row and columns address decoders to select cells $S_1$, which are the cells under test. The row address decoder receives the higher six bits of the refresh counter, and the column address decoder receives eight bits, in this specific illustrative embodiment. Whenever the row address changes, the data stroed in the data buffer is written into the cells selected by the two address decoders. A refresh operation initializes all cells in $M_s(k)$. Thus, only two refresh operations complete the data pattern initialization.

Now, the test sequence generator repeatedly issues the excitation subsequence using the refresh logic under control of a shift counter (not shown) in test sequences generator 33. The shift counter is incremented when a shift operation is performed, and overflows when the test bit is stored into every cell at least once, to indicate completion of an excitation sequence. After each shift operation, consecutive memory write operations are generated. The cell to be written is selected by routing the contents of the shift counter to the row and column address decoders. The completion of this write operation is indicated by the initialization of the next shift operation by the refresh logic.

As shown in FIG. 2, certain ones of the peripheral circuits, such as data buffer 50 and refresh control and timing system 40 are all made self-testing by duplication and comparison. Thus, data buffer 50 is shown to have a redundant data buffer 50A, and similarly, a redundant refresh control and timing system 40A is provided.

Column address buffer 27 and row address buffer 28 are each tested by applying write and read operations to each buffer cell. The test sequences for the partitions constitute the tests for the address buffers.

Figure 5:
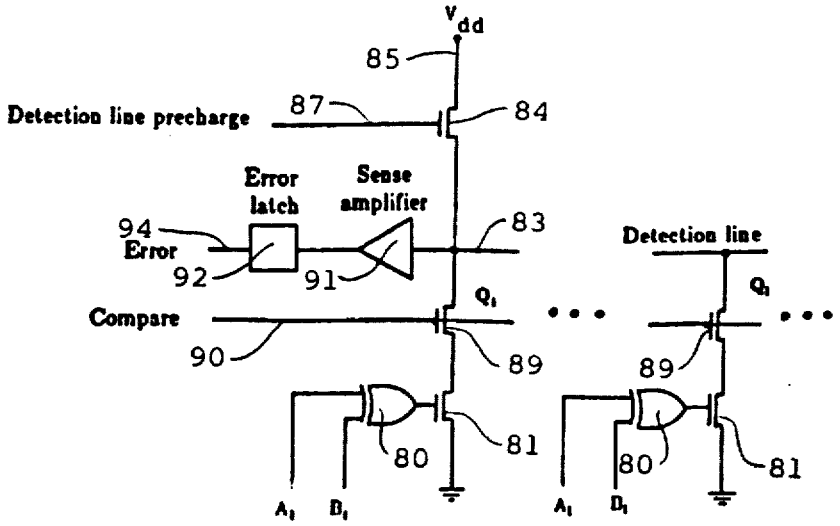
FIG. 5 is a schematic representation of logic circuitry, gates, and an amplifier organized to perform a comparison function in accordance with the invention.

FIG. 5 is a schematic representation of a comparator circuit which is useful for testing the partitions and the address buffers. In the specific embodiment described herein, q exclusive-OR gates 80 are connected at their respective outputs to respective transistor gates 81. A detection line 83 is connected to a transistor gate 84 which selectably couples the detection line to a predetermined voltage at a terminal 85. Thus, detection line 83 is charged to the preselected voltage, illustratively, $V_{dd}$, upon application of an appropriate signal at detection line precharge input 87. Detection line 83 is connected to each of gates 81 via transistor gates 89. Gates 89 are each coupled to a common control input. Thus, a comparison is effected when an appropriate comparison signal is applied to a comparison line 90. In operation, therefore, the detection line voltage is applied to each of gates 81 upon the application of the comparison signal at line 90. However, if there is a discrepancy between the signals at the inputs $A_1$ and $B_1$ of each exclusive-OR gate 80, then the gate 81 associated with such an OR gate will assume, in this specific embodiment, a conductive state, thereby discharging detection line 83. Such a discharge of detection line 83 is detected by a sense amplifier 91, and an error signal is generated by an error latch 92.

The presence of an error signal at line 94 connected to error latch 92 halts the testing process. Line 94 is coupled to test step selector 31. When a test is halted as a result of a fault, the contents of the n-bit refresh counter are counted out through the data signal line under control of the column address strobe signal.

Figure 6:
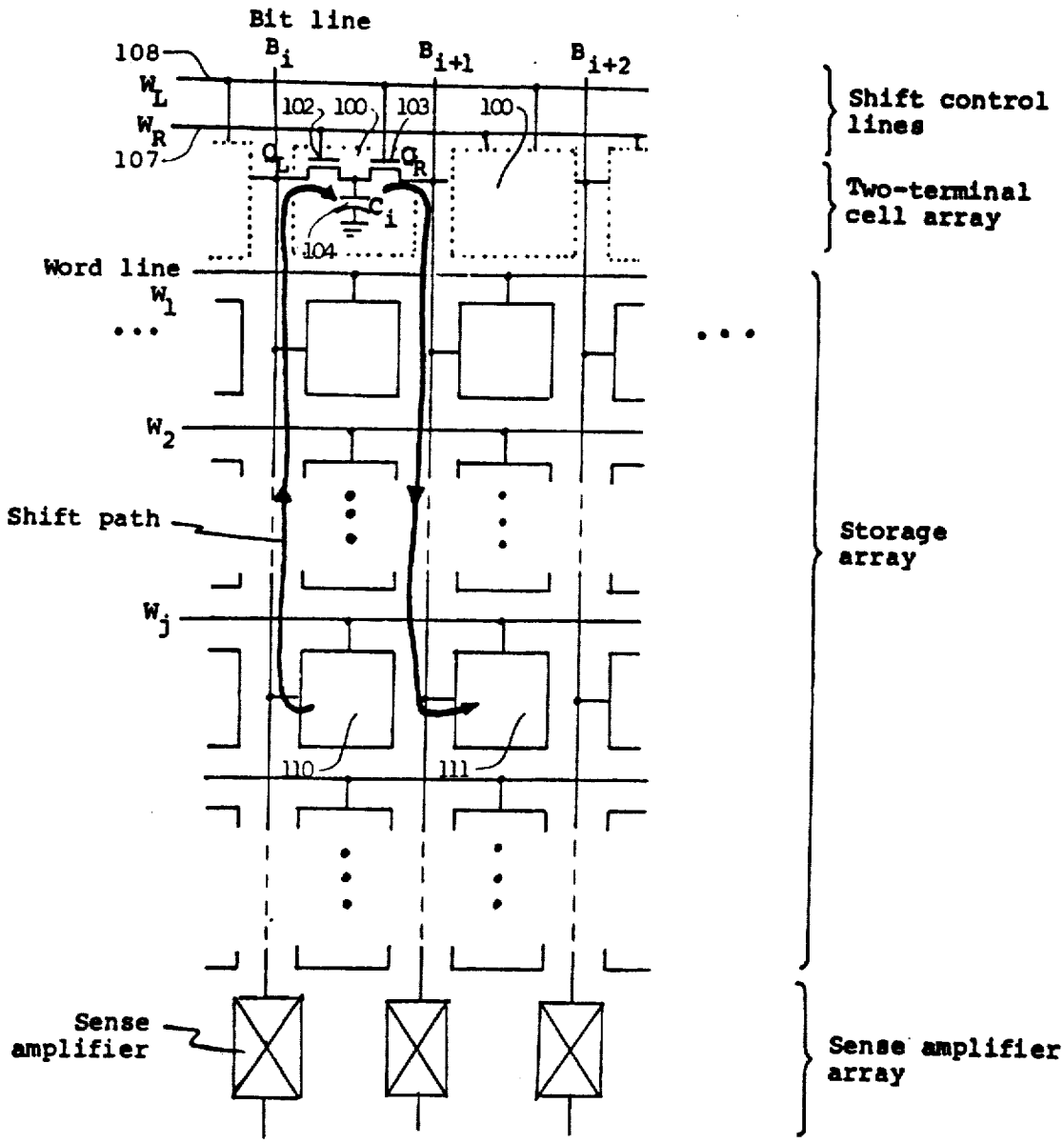
FIG. 6 is a partially schematic and block and line representation of a dynamic memory arrangement utilizing an array of bilateral storage cells constructed in accordance with the invention for performing the shift operation.

The shifting function described hereinabove can be implemented by the use of two-terminal storage cells, as shown in FIG. 6. This figure shows a two-terminal, or bilateral storage cell 100 which is replicated for each column of each storage array. The bilateral storage cell is formed with two transistors, 102 and 103, coupled to one another and to a storage capacitor 104. Transistor gates 102 and 103 are connected to control lines 107 and 108, respectively.

For purposes of illustrating the operation of storage cell 100, it is assumed that the logic state of a storage cell 110 is desired to be transferred to a storage cell 111, which is adjacent thereto and in a different column of the storage array. The logic state of storage cell 11 is transferred via bit line $B_i$, through transistor gate 102, and stored in storage capacitor 104. Immediately thereafter, the contents of the storage capacitor are conducted through transistor gate 103 and to storage cell 111 via bit line $B_{i+1}$. Storage capacitor 104 can be accessed from both bit lines $B_i$ and $B_{i+1}$, by activation of control lines 107 and 108. An additional flip-flop (not shown), as described with respect to FIG. 3, can be provided to effect recirculation of the endmost bit, and thereby render each row of the storage array to be the equivalent of a circular shift register. As previously discussed, the entire storage array can be made into a p by q bit circular shift register.

The shifting method described with respect to FIG. 6 may require greater integrated circuit chip area than that described hereinabove with respect to FIG. 3. However, the additional row of two-terminal cells may be used as a redundant row to replace faulty rows, thereby resulting in higher manufacturing yield. Moreover, use of the two-terminal storage cells will not require any modification to the standard sense amplifier array.

In accordance with a significant further aspect of the invention, complementary data patterns can be used to detect faults which occur simultaneously in symmetric locations within the memory. Instead of placing identical data patterns in all of the partitions of the memory, mutually complementary patterns can be used in each pair of partitions. The two partitions are initiated using complementary test bits x and $\bar{x}$. This design modification is implemented by incorporating an inverter in the test bit lines connected to the initialization circuits in one partition of the pair. The comparison of test responses from partitions is carried out using a difference checker. This is similar to the equality checker shown in FIG. 5, but with inverted inputs. Such symmetrical faults are not detectable with direct comparison since the two data bits to be compared are changed in the same way by the faults.

Irrespective of whether identical or complementary data patterns are used in the practice of the invention, the new background data patterns required for testing are created by shifting the contens of the RAM. As described herein, shifting of the entire data pattern may be achieved using the refresh circuit in the RAM. Also, shifting of the data pattern may be achieved by using additional pass transistors between two adjacent sense amplifiers, and an additional flip-flop. Alternatively, such shifting can be achieved using an additional row of two-terminal storage cells, and the additional flip-flop.

The storing of the same background data pattern into several identical partitions, and verifying using on-chip comparison circuits, whereby disagreement indicates the presence of faults, can be initialized by holding bit lines at one logical value and activating all word lines using the refresh logic circuitry. The initial selection of test cells can be achieved by routing the contents of the n-bit refresh counter into the address decoders. As described herein, the contents of the n-bit refresh counter are sent to the column address decoder, and the most significant n-2 bits of the refresh counter are sent to the row address decoder. Initialization of the data patterns may be done by using the refresh logic.

Although the invention has been described in terms of specific embodiments and applications, persons skilled in the art can, in light of this teaching, generate additional embodiments without exceeding the scope or departing from the spirit of the claimed invention. Accordingly, it is to be understood that the drawings and descriptions in this disclosure are proffered to facilitate comprehension of the invention and should not be construed to limit the scope thereof.

What is claimed is:

1. A method of testing a random access memory (RAM) integrated circuit of the type having at least first and second storage arrays of storage cells, each storage array being arranged as an array of rows and columns of the storage cells, the method comprising the steps of:

generating a data test pattern with a test generator and a refresh circuit, each being formed integrally with the RAM integrated circuit;

writing a selectable complement of said data test pattern into each of the first and second storage arrays;

shifting the data in each column of each storage array to an adjacent column using a plurality of shift gates whereby each row of each storage array functions as a shift register;

precharging a detection conductor to a predetermined voltage;

comparing the data stored in a column of the first storage array with the data stored in a corresponding column of the second storage array, said comparison being performed by comparator circuitry formed integrally with the RAM integrated circuit; and subjecting said detection conductor to discharge depending upon whether said first and second storage arrays store correspondingly similar data.

2. The method of claim 1 wherein after said step of writing there is provided the further step of refreshing each storage cell using said refresh circuit.

3. The method of claim 1 wherein prior to performing said step of writing there is provided the further step of selecting an initial storage cell to be tested using a refresh circuit counter for forming addresses in the rows and columns.

4. The method of claim 1 wherein said step of shifting comprises the further steps of:

incrementing a shift counter, and repeating said steps of shifting and incrementing until said shift counter overflows.

5. The method of claim 1 wherein said step of subjecting comprises the step of applying data stored in said first and second storage arrays to respective inputs of an exclusive-OR gate.

6. The method of claim 1 wherein there is provided the further step of providing an indicator signal responsive to said step of subjecting.

7. An integrated circuit comprising:

at least first and second random access memory (RAM) arrays, each formed of a plurality of storage cells for storing information organized in rows and columns, said RAM arrays being formed integrally on the integrated circuit;

first and second address decoders for selecting a desired row and column, respectively, whereby desired ones of said storage cells are identified, said address decoders [beings] *being* formed integrally on the integrated circuit;

refresh circuit means coupled to said first and second address decoders for restoring an informational state of said plurality of said storage cells, said refresh circuit means being formed integrally on the integrated circuit;

counter means incorporated in said refresh circuit means for identifying a location of a defective storage cell, said counter means being formed integrally on the integrated circuit;

sense amplifier means for detecting said informational state of said storage cells, said sense amplifier means being formed integrally on the integrated circuit;

shift control means coupled to said sense amplifier means for transferring said [information] *informational* state from a first one of said storage cells to a preselected second one of said storage cells;

data buffer means for conducting data signals corresponding to said informational state of said storage cells, said data buffer means being formed integrally on the integrated circuit;

test generator means coupled to said refresh circuit means and to said sense amplifier means for generating a predetermined test pattern sequence which is applied to said first and second RAM arrays, said test generator means being formed integrally on the integrated circuit; and comparator means for comparing corresponding sequences of response signals from said first and second RAM arrays, said response signals being responsive to said predetermined test pattern sequence, said comparator means being formed integrally on the integrated circuit.

8. The integrated circuit of claim 7 wherein said [shaft] *shift* control means comprises:

return amplifier means having an input terminal coupled to an output terminal of said sense amplifier means; and gate means responsive to a shift control signal for establishing a propagation path for propagating a signal corresponding to said informational state transferred between said first and second storage cells.

9. The integrated circuit of claim 8 wherein said shift control means further comprises a plurality of further sense amplifiers, each associated with a respective one of said columns, whereby each of said rows of said first and second RAM arrays is operable as a shift register.

10. The integrated circuit of claim 8 wherein said test generator means comprises:

test step selector means for selecting said predetermined test pattern sequence;

initialization sequence generator means responsive to said test step selector means for producing a write sequence for transferring a data pattern into said RAM arrys; and test sequence generator means coupled to said refresh circuit means and said shift control means for generating said shift control signal.

11. The integrated [circuitry] *circuit* of claim 7 comprising a further refresh circuit means for operating redundantly with said refresh circuit means.

12. The integrated circuit of claim 7 comprising a further data buffer means for operating redundantly with said data buffer means.

13. The integrated circuit of claim 7 wherein said comparator means comprises:

precharge gate for establishing a predetermined logic state on a test conductor; and comparison gate means for selectably maintaining a predetermined logic state only when said corresponding response signals from respective ones of said RAM arrays agree with one another.

14. The integrated circuit of claim 13 wherein said comparison gate means comprises exclusive-OR gate means having first and second inputs for receiving said corresponding response signals from said RAM arrays.

15. The integrated circuit of claim 7 wherein there is further provided bilateral storage cell means for receiving a logic state signal from one of said storage cells, storing said logic state signal, and transferring said logic state signal to a further one of said storage cells.

16. The integrated circuit of claim 15 wherein said bilateral storage cell means further comprises:

storage capacitor means for storing said logic state signal; and first and second gate means for accepting and sending said logic state signal, respectively.

*17. An apparatus for performing on-chip testing of a random access memory (RAM) integrated circuit chip, including at least two memory arrays formed of a plurality of memory cells and a refresh circuit, said apparatus comprising:*

*test generator means, formed on said RAM integrated circuit chip and coupled to said refresh circuit, for generating a predetermined test pattern sequence of logic states on said RAM chip and for applying said predetermined test pattern to said at least two memory arrays, said test generator means including means for generating a control signal;*

*shift means, formed on said RAM integrated circuit chip and responsive to said control signal generated by said test generator means for shifting the logic states of said plurality of memory cells to different ones of said plurality of memory cells;*

*comparison means, formed on said RAM integrated circuit chip, for comparing the logic states of predetermined memory cells in said at least two memory arrays on said RAM integrated circuit chip, to detect failures in said RAM integrated circuit chip.*

*18. An apparatus according to claim 17, wherein said test generator means further comprises:*

*test step selector means for selecting said predetermined test pattern sequence; and*

*initialization sequence generator means responsive to said test step selector means for producing a write sequence for transferring a data pattern into said at least two memory arrays.*

*19. An apparatus according to claim 17, wherein said shift means includes storage means for temporarily storing said logic states of said memory cells before shifting said logic states to said different ones of said memory cells.*

*20. An apparatus according to claim 17, wherein said comparator means comprises:*

*precharge gate means for establishing a predetermined logic state on a test output line; and*

*comparison gate means for maintaining said predetermined logic state when the logic states of said predetermined memory cells in said at least two memory arrays are the same and for changing said predetermined logic state when the logic states of said predetermined memory cells in said at least two memory arrays are different.*

*21. An apparatus according to claim 17, wherein said refresh circuit includes counter means for identifying a location of a failure in said RAM integrated circuit chip.*

*22. An apparatus according to claim 17, wherein said plurality of memory cells are arranged in rows and columns in each of said at least two memory arrays;*

*wherein said apparatus further comprises:*

*first and second address decoders for selecting a desired row and column, respectively, in each of said at least two memory arrays.*

*23. An apparatus according to claim 17, wherein said shift means comprises:*

*a plurality of sense amplifiers; and*

*control means, coupled to said sense amplifiers and responsive to said control signal, for shifting the logic states of said plurality of memory cells through predetermined sense amplifiers to said different ones of said plurality of memory cells.*

*24. An apparatus according to claim 23, wherein said control means comprises a plurality of transistors operatively connected to receive said control signal.*

*25. An apparatus for performing on-chip testing of a random access memory (RAM) integrated circuit chip, including at least two memory arrays formed of a plurality of memory cells, said apparatus comprising:*

*first means, formed on said RAM integrated circuit chip, for generating a predetermined test pattern sequence of logic states on said RAM integrated circuit chip;*

*second means, formed on said RAM integrated circuit chip, for refreshing said memory cells of said at least two memory arrays;*

*third means, formed on said RAM integrated circuit chip, for selecting at least one test cell out of said plurality of memory cells;*

*fourth means, formed on said RAM integrated circuit chip, for comparing the logic states of predetermined memory cells in said at least two memory arrays;*

*fifth means, formed on said RAM integrated circuit chip, for generating a control signal; and*

*sixth means, formed on said RAM integrated circuit chip and responsive to said control signal generated by said fifth means, for shifting said logic states of said plurality of memory cells to different ones of said plurality of memory cells.*

*26. A method of performing on-chip testing of a random access memory (RAM) integrated circuit chip, including at least two memory arrays formed of a plurality of memory cells and a refresh circuit, the method comprising the steps of:*

*generating a predetermined test pattern sequence of logic states on said RAM integrated circuit chip;*

*applying said predetermined test pattern sequence to said memory cells of said at least two memory arrays;*

*generating a control signal on said RAM integrated circuit chip;*

*shifting the logic states of said plurality of memory cells to different ones of said plurality of memory cells in response to said control signal; and*

*comparing the logic states of predetermined memory cells in said at least two memory arrays on said RAM integrated circuit chip to detect failures in said RAM integrated circuit chip.*

*27. A method according to claim 26, further comprising the step of selecting an initial storage cell to be tested using information stored in a counter in said refresh circuit.*

*28. A method of performing on-chip testing of a random access memory (RAM) integrated circuit chip, including at*

*least two memory arrays formed of a plurality of memory cells, said method comprising the steps of:*

*generating, on said RAM integrated circuit chip, a predetermined test pattern sequence of logic states;*

*writing said predetermined test pattern sequence of logic states into said memory cells of said at least two memory arrays;*

*selecting an initial storage cell to be tested;*

*comparing, on said RAM integrated circuit chip, the logic states of predetermined memory cells in said at least two memory arrays;*

*generating a control signal on said RAM integrated circuit chip; and*

*shifting the logic states of said plurality of memory cells of said at least two memory arrays to different one of said plurality of memory cells in said at least two memory arrays in response to said control signal.*

*29. An integrated circuit comprising:*

*at least first and second random access memory (RAM) arrays, each formed of a plurality of storage cells for storing information organized in rows and columns, said RAM arrays being formed integrally on the integrated circuit;*

*first and second address decoders for selecting a desired row and column, respectively, whereby desired ones of said storage cells are identified, said address decoders being formed integrally on the integrated circuit;*

*refresh circuit means coupled to said first and second address decoders for restoring an informational state of said plurality of said storage cells, said refresh circuit means being formed integrally on the integrated circuit;*

*sense amplifier means for detecting said informational state of said storage cells, said sense amplifier means being formed integrally on the integrated circuit;*

*data buffer means for conducting data signals corresponding to said informational state of said storage cells, said data buffer means being formed integrally on the integrated circuit;*

*test generator means coupled to said refresh circuit means and to said sense amplifier means for generating a predetermined test pattern sequence which is applied to said first and second RAM arrays, said predetermined test pattern sequence being generated on said integrated circuit;*

*comparator means for comparing corresponding sequences of response signals from said first and second RAM arrays on said integrated circuit.*

*30. The integrated circuit of claim 29 further comprising:*

*return amplifier means having an input terminal coupled to an output terminal of said sense amplifier means; and*

*gate means responsive to a shift control signal for establishing a propagation path for propagating a signal corresponding to said informational state transferred between said first and secons storage cells.*

*31. The integrated circuit of claim 30 wherein there is provided a plurality of further sense amplifier means, each associated with a respective one of said columns, whereby each of said rows of said first and second RAM arrays is operable as a shift register.*

*32. The integrated circuit of claim 30 wherein said test generator means comprises:*

*test step selector means for selecting said predetermined test pattern sequence;*

*initialization sequence generator means responsive to said test step selector means for producing a write sequence for transferring a data pattern into said RAM arrays; and*

*test sequence generator means coupled to said refresh circuit means and said shift control means for generating said shift control signal.*

*33. The integrated circuit of claim 29 comprising a further refresh circuit means for operating redundantly with said refresh circuit means.*

*34. The integrated circuit of claim 29 comprising a further data buffer means for operating redundantly with said data buffer means.*

*35. The integrated circuit of claim 29 wherein said comparator means comprises:*

*precharge gate means for establishign a predetermined logic state on a test conductor; and*

*comparison gate means for selectably maintaining a predetermined logic state only when said corresponding response signals from respective ones of said RAM arrays agree with one another.*

*36. The integrated circuit of claim 35 wherein said comparison gate means comprises exclusive-OR gate means having first and second inputs for receiving said corresponding response signals from said RAM arrays.*

*37. The integrated circuit of claim 29 wherein there is further provided bilateral storage cell means for storing said informational state of one of the storage cells and transferring said informational state to a further one of said storage cells.*

*38. The integrated circuit of claim 37 wherein said bilateral storage cell means further comprises:*

*storage capacitor means for storing said informational state; and*

*first and second gate means for accepting and sending said informational state, respectively.*

*39. A method of testing a random access memory (RAM) integrated circuit of the type having at least first and second storage arrays of storage cells, each storage array being arranged as an array of rows and columns of the storage cells, the method comprising the steps of:*

*generating, on said RAM integrated circuit, a data test pattern with a test generator and a refresh circuit, each being formed integrally with the RAM integrated circuit;*

*writing a selectable complement of said data test pattern into each of the first and second storage arrays;*

*shifting the data in each column of each storage array to an adjacent column using a plurality fo shift gates whereby each row of each storage array functions as a shift register; and*

*comparing the data stored in a column of the first storage array with the data stored in a corresponding column of the second storage array, said comparison being performed by comparator circuitry formed integrally with the RAM integrated circuit.*

*40. The method of claim 39 wherein after said step of writing there is provided the further step of refreshing each storage cell using said refresh circuit.*

*41. The method of claim 39 wherein prior to performing said step of writing there is provided the further step of selecting an initial storage cell to be tested using a refresh circuit counter for forming addresses in the rows and columns.*

*42. The method of claim 39 wherein said step of shifting comprises the further steps of:*

*incrementing a shift counter; and*

*repeating said steps of shifting and incrementing until said shift counter overflows.*

* * * * *